United States Patent
Swoboda

(10) Patent No.: US 7,113,902 B2
(45) Date of Patent: Sep. 26, 2006

(54) DATA PROCESSING CONDITION DETECTOR WITH TABLE LOOKUP

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 862 days.

(21) Appl. No.: 09/798,555

(22) Filed: Mar. 2, 2001

(65) Prior Publication Data

US 2001/0047253 A1    Nov. 29, 2001

Related U.S. Application Data

(60) Provisional application No. 60/186,326, filed on Mar. 2, 2000, provisional application No. 60/219,340, filed on Mar. 2, 2000.

(51) Int. Cl.
   *G06F 9/455* (2006.01)
   *G06F 11/00* (2006.01)
(52) U.S. Cl. ........................... 703/28; 714/28
(58) Field of Classification Search ............ 703/23, 703/28; 326/40, 39; 716/18; 714/28
   See application file for complete search history.

(56) References Cited

U.S. PATENT DOCUMENTS

| | | | |
|---|---|---|---|
| 5,757,207 A | * | 5/1998 | Lytle et al. ............ 326/39 |
| 5,777,489 A | * | 7/1998 | Barbier et al. ............ 326/40 |
| 5,821,773 A | * | 10/1998 | Norman et al. ............ 326/39 |
| 5,828,824 A | | 10/1998 | Swoboda ............ 395/183.01 |
| 6,340,897 B1 | * | 1/2002 | Lytle et al. ............ 326/40 |

OTHER PUBLICATIONS

ARM Limited, RDI 1.5.1tx and RDI 1.5.1rt; Doc. No. RDI-0032-CUST-ESPC-A; May 19, 2000; pp. 1-55.
ARM Limited, ETM9, Rev. 1, Technical Reference Manual, Doc. No. DDI 0157C, pp. i-Index-3.
ARM Limited, Embedded Trace Macrocell, Rev. 1, Specification, Doc. No. IHI 0014E, pp. i-Index-3.

* cited by examiner

*Primary Examiner*—Paul Rodriguez
*Assistant Examiner*—Dwin M. Craig
(74) *Attorney, Agent, or Firm*—Robert D. Marshall, Jr.; W. James Brady, III; Frederick J. Telecky, Jr.

(57) ABSTRACT

In support of data processing emulation, a data processing condition indicated by a predetermined number of digital data processing signals can be detected by applying the digital data processing signals to a lookup table (LUT) that is programmable according to how the digital data processing signals (23) indicate the data processing condition. The lookup table is responsive to said digital data processing signals for determining whether said data processing condition exists.

16 Claims, 1 Drawing Sheet

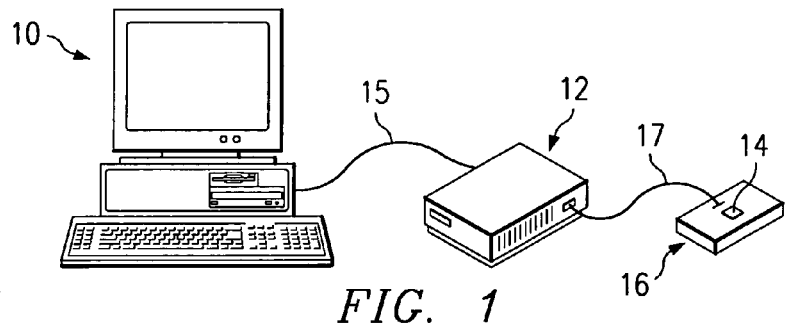
FIG. 1
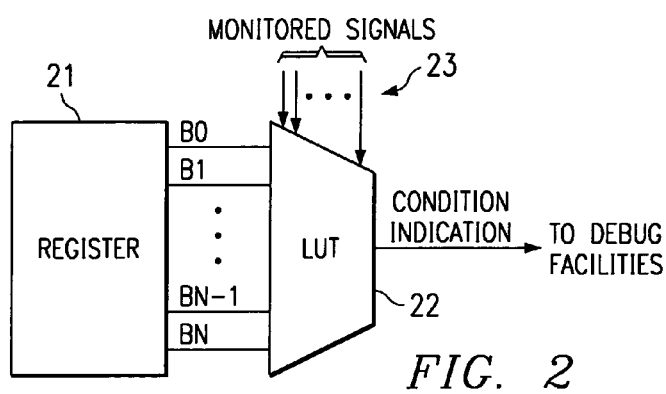
FIG. 2
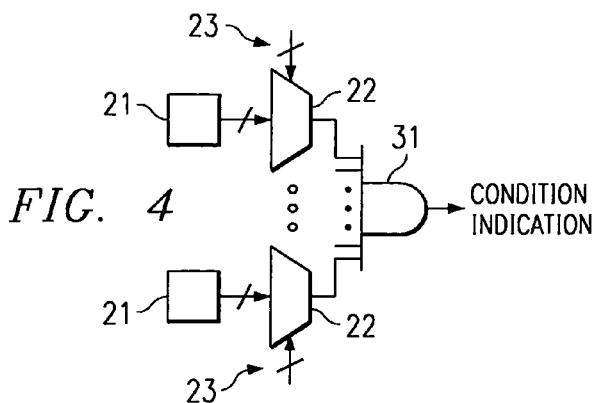
FIG. 4
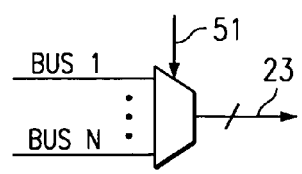
FIG. 5
| TRUTH TABLE | | | | | |
|---|---|---|---|---|---|
| MONITORED SIGNAL LEVELS | B0 | B1 | B2 | ··· | BN |
| 0 0 ··· 0 0 0 | 0 | 0 | 1 | | 0 |
| 0 0 ··· 0 0 1 | 0 | 0 | 0 | ··· | 0 |
| ⋮ | ⋮ | ⋮ | ⋮ | | ⋮ |
| 1 1 ··· 1 1 1 | 1 | 1 | 0 | | 0 |
FIG. 3

DATA PROCESSING CONDITION DETECTOR WITH TABLE LOOKUP

This application claims the priority under 35 U.S.C. 119(e)(1) of the following co-pending U.S. provisional applications: 60/186,326 filed on Mar. 2, 2000 now U.S. patent application Ser. No. 09/798,173; and 60/219,340 originally filed on Mar. 2, 2000 as non-provisional U.S. Ser. No. 09/515,093 and thereafter converted to provisional application status by a petition granted on Aug. 18, 2000.

FIELD OF THE INVENTION

The invention relates generally to electronic data processing and, more particularly, to emulation, simulation and test capabilities of electronic data processing devices and systems.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive realtime debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large amount of subsequent design time is expended on test pattern creation and upgrading.

Even if a significant investment were made to design a module to be reusable and to fully create and grade its test patterns, subsequent use of the module may bury it in application specific logic, and make its access difficult or impossible. Consequently, it is desirable to avoid this pitfall.

The advances of IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

Emulation technology utilizing scan based emulation and multiprocessing debug was introduced over 10 years ago. In 1988, the change from conventional in circuit emulation to scan based emulation was motivated by design cycle time pressures and newly available space for on-chip emulation. Design cycle time pressure was created by three factors: higher integration levels—such as on-chip memory; increasing clock rates—caused electrical intrusiveness by emulation support logic; and more sophisticated packaging—created emulator connectivity issues.

Today these same factors, with new twists, are challenging a scan based emulator's ability to deliver the system debug facilities needed by today's complex, higher clock rate, highly integrated designs. The resulting systems are smaller, faster, and cheaper. They are higher performance with footprints that are increasingly dense. Each of these positive system trends adversely affects the observation of system activity, the key enabler for rapid system development. The effect is called "vanishing visibility".

Application developers prefer visibility and control of all relevant system activity. The steady progression of integration levels and increases in clock rates steadily decrease the visibility and control available over time. These forces create a visibility and control gap, the difference between the desired visibility and control level and the actual level available. Over time, this gap is sure to widen. Application development tool vendors are striving to minimize the gap growth rate. Development tools software and associated hardware components must do more with less and in different ways; tackling the ease of use challenge is amplified by these forces.

With today's highly integrated System-On-a-Chip (SOC) technology, the visibility and control gap has widened dramatically. Traditional debug options such as logic analyzers and partitioned prototype systems are unable to keep pace with the integration levels and ever increasing clock rates of today's systems.

As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed, building system components in a way that enabled the construction of prototyping systems with exposed buses. This approach is also under siege from the ever-increasing march of system clock rates. As CPU clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. We have entered an era where production devices must serve as the platform for application development.

Increasing CPU clock rates are also accelerating the demise of other simple visibility mechanisms. Since the CPU clock rates can exceed maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity.

As visibility and control diminish, the development tools used to develop the application become less productive. The tools also appear harder to use due to the increasing tool complexity required to maintain visibility and control. The visibility, control, and ease of use issues created by systems-on-a-chip are poised to lengthen product development cycles.

Even as the integration trends present developers with a difficult debug environment, they also present hope that new approaches to debug problems will emerge. The increased densities and clock rates that create development cycle time pressures also create opportunities to solve them.

On-chip, debug facilities are more affordable than ever before. As high speed, high performance chips are increasingly dominated by very large memory structures, the system cost associated with the random logic accompanying the CPU and memory subsystems is dropping as a percentage of total system cost. The cost of a several thousand gates is at an all time low, and can in some cases be tucked into a corner of today's chip designs. Cost per pin in today's high density packages has also dropped, making it easier to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs.

Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

The emulation technology of the present invention uses the debug upside opportunities noted above to provide developers with an arsenal of debug capability aimed at narrowing the control and visibility gap.

This emulation technology delivers solutions to the complex debug problems of today's highly integrated embedded real-time systems. This technology attacks the loss of visibility, control, and ease of use issues described in the preceding section while expanding the feature set of current emulators.

The on-chip debug component of the present invention provides a means for optimizing the cost and debug capabilities. The architecture allows for flexible combinations of emulation components or peripherals tailored to meet system cost and time to market constraints. The scalability aspect makes it feasible to include them in production devices with manageable cost and limited performance overhead.

BRIEF DESCRIPTION OF THE DRAWINGS

FIG. 1 diagrammatically illustrates exemplary embodiments of an emulation system according to the invention.

FIG. 2 diagrammatically illustrates an exemplary embodiment of a condition detector according to the invention.

FIG. 3 illustrates an exemplary truth table which describes a desired relationship between the monitored signals of FIG. 2 and the register contents of FIG. 2.

FIG. 4 diagrammatically illustrates exemplary embodiments of an extended condition detector according to the invention.

FIG. 5 diagrammatically illustrates examples of how the monitored signals of FIGS. 2 and 4 can be developed.

DETAILED DESCRIPTION

Emulation, debug, and simulation tools of the present invention are described herein. The emulation and debug solutions described herein are based on the premise that, over time, some if not most debug functions traditionally performed off chip must be integrated into the production device if they are to remain in the developer's debug arsenal. To support the migration of debug functions on chip, the present invention provides a powerful and scalable portfolio of debug capabilities for on-chip deployment. This technology preserves all the gains of initial JTAG technology while adding capabilities that directly assault the visibility, control, and ease of use issues created by the vanishing visibility trend.

Four significant architectural infrastructure components spearhead the assault on the control and visibility gap described earlier herein:

1. Real-time Emulation (RTE);

2. Real-time Data Exchange (RTDX™ a trademark of Texas Instruments Incorporated);

3. Trace; and

4. Advanced Analysis.

These components address visibility and control needs as shown in Table 1.

TABLE 1

Emulation System Architecture and Usage

| Architectural Component | Visibility Provisions | Control Provisions | Debug Usage |
|---|---|---|---|
| RTE | Static view of the CPU and memory state after background program is stopped. Interrupt driven code continues to execute. | Analysis components are used to stop execution of background program. | Basic debug Computational problems Code design problems |
| RTDX ™ | Debugger software interacts with the application code to exchange commands and data while the application continues to execute. | Analysis components are used to identify observation points and interrupt program flow to collect data. | Dynamic instrumentation Dynamic variable adjustments Dynamic data collection |
| Trace | Bus snooper hardware collects selective program flow and data transactions for export without interacting with the application. | Analysis components are used to define program segments and bus transactions that are to be recorded for export. | Prog. Flow corruption debug Memory corruption Benchmarking Code Coverage Path Coverage Program timing problems |
| Analysis | Allows observation of occurrences of events or event sequences. Measure elapsed time between events. Generate external triggers. | Alter program flow after the detection of events or event sequences. | Benchmarking Event/sequence identification Ext. trigger generation Stop program execution Activate Trace and RTDX ™ |

Real-Time Emulation (RTE) provides a base set of fixed capabilities for real-time execution control (run, step, halt, etc.) and register/memory visibility. This component allows the user to debug application code while real-time interrupts continue to be serviced. Registers and memory may be accessed in real-time with no impact to interrupt processing. Users may distinguish between real-time and non real-time interrupts, and mark code that must not be disturbed by real-time debug memory accesses. This base emulation capability includes hardware that can be configured as two single point hardware breakpoints, a single data watchpoint, an event counter, or a data logging mechanism. The EMU pin capability includes trigger I/Os for multiprocessor event processing and a uni-directional (target to host) data logging mechanism.

RTDX™ provides real-time data transfers between an emulator host and target application. This component offers both bi-directional and uni-directional DSP target/host data transfers facilitated by the emulator. The DSP (or target) application may collect target data to be transferred to the host or receive data from the host, while emulation hardware (within the DSP and the emulator) manages the actual transfer. Several RTDX™ transfer mechanisms are supported, each providing different levels of bandwidth and pin utilization allowing the trade off of gates and pin availability against bandwidth requirements.

Trace is a non-intrusive mechanism of providing visibility of the application activity. Trace is used to monitor CPU related activity such as program flow and memory accesses, system activity such as ASIC state machines, data streams and CPU collected data. Historical trace technology also used logic analyzer like collection and special emulation (SEs) devices with more pins than a production device. The logic analyzer or like device processed native representations of the data using a state machine like programming interface (filter mechanism). This trace model relied on all activity being exported with external triggering selecting the data that needed to be stored, viewed and analyzed.

Existing logic analyzer like technology does not, however, provide a solution to decreasing visibility due to higher integration levels, increasing clock rates and more sophisticated packaging. In this model, the production device must provide visibility through a limited number of pins. The data exported is encoded or compressed to reduce the export bandwidth required. The recording mechanism becomes a pure recording device, packing exported data into a deep trace memory. Trace software is used to convert the recorded data into a record of system activity.

On-chip Trace with high speed serial data export, in combination with Advanced Analysis provides a solution for SOC designs. Trace is used to monitor CPU related activity such as program flow and memory accesses, system activity such as ASIC state machines, data streams etc. and CPU collected data. This creates four different classes of trace data:

Program flow and timing provided by the DSP core (PC trace);

Memory data references made by the DSP core or chip level peripherals (Data reads and writes);

Application specific signals and data (ASIC activity); and

CPU collected data.

Collection mechanisms for the four classes of trace data are modular allowing the trade off of functionality verses gates and pins required to meet desired bandwidth requirements.

The RTDX™ and Trace functions provide similar, but different forms of visibility. They differ in terms of how data is collected, and the circumstances under which they would be most effective. A brief explanation is included below for clarity.

RTDX™ (Real Time Data eXchange) is a CPU assisted solution for exchanging information; the data to be exchanged have a well-defined behavior in relation to the program flow. For example, RTDX™ can be used to record the input or output buffers from a DSP algorithm. RTDX™ requires CPU assistance in collecting data hence there is definite, but small, CPU bandwidth required to accomplish this. Thus, RTDX™ is an application intrusive mechanism of providing visibility with low recurring overhead cost.

Trace is a non-intrusive, hardware-assisted collection mechanism (such as, bus snoopers) with very high bandwidth (BW) data export. Trace is used when there is a need to export data at a very high data rate or when the behavior of the information to be traced is not known, or is random in nature or associated with an address. Program flow is a typical example where it is not possible to know the behavior a priori. The bandwidth required to export this class of information is high. Data trace of specified addresses is another example. The bandwidth required to export data trace is very high.

Trace data is unidirectional, going from target to host only. RTDX™ can exchange data in either direction although unidirectional forms of RTDX™ are supported (data logging). The Trace data path can also be used to provide very high speed uni-directional RTDX™ (CPU collected trace data).

The high level features of Trace and RTDX™ are outlined in Table 2.

TABLE 2

RTDX ™ and Trace Features

| Features | RTDX ™ | Trace |
|---|---|---|
| Bandwidth/pin | Low | High |
| Intrusiveness | Intrusive | Non-intrusive |
| Data Exchange | Bi-directional or uni-directional | Export only |
| Data collection | Cpu assisted | CPU or Hardware assisted |
| Data transfer | No extra hardware for minimum BW (optional hardware for higher BW) | Hardware assisted |
| Cost | Relatively low recurring cost | Relatively high recurring cost |

Advanced analysis provides a non-intrusive on-chip event detection and trigger generation mechanism. The trigger outputs created by advanced analysis control other infrastructure components such as Trace and RTDX™. Historical trace technology used bus activity exported to a logic analyzer to generate triggers that controlled trace within the logic analyzer unit or generated triggers which were supplied to the device to halt execution. This usually involved a chip that had more pins than the production device (an SE or special emulation device). This analysis model does not work well in the System-on-a-Chip (SOC) era as the integration levels and clock rates of today's devices preclude full visibility bus export.

Advanced analysis provides affordable on-chip instruction and data bus comparators, sequencers and state machines, and event counters to recreate the most important portions of the triggering function historically found off chip. Advanced analysis provides the control aspect of debug triggering mechanism for Trace, RTDX™ and Real-Time Emulation. This architectural component identifies events, tracks event sequences, and assigns actions based on their occurrence (break execution, enable/disable trace, count, enable/disable RTDX™, etc.). The modular building blocks for this capability include bus comparators, external event generators, state machines or state sequencers, and trigger generators. The modularity of the advanced analysis system allows the trade off of functionality versus gates.

Emulator capability is created by the interaction of four emulator components:

1. debugger application program;

2. host computer;

3. emulation controller; and 4. on-chip debug facilities.

These components are connected as shown in FIG. 1. The host computer 10 is connected to an emulation controller 12 (external to the host) with the emulation controller (also referred to herein as the emulator or the controller) also connected to the target system 16. The user preferably controls the target application through a debugger application program, running on the host computer, for example, Texas Instruments' Code Composer Studio program.

A typical debug system is shown in FIG. 1. This system uses a host computer 10 (generally a PC) to access the debug capabilities through an emulator 12. The debugger application program presents the debug capabilities in a user-friendly form via the host computer. The debug resources are allocated by debug software on an as needed basis, relieving the user of this burden. Source level debug utilizes the debug resources, hiding their complexity from the user. The debugger together with the on-chip Trace and triggering facilities provide a means to select, record, and display chip activity of interest. Trace displays are automatically correlated to the source code that generated the trace log. The emulator provides both the debug control and trace recording function.

The debug facilities are programmed using standard emulator debug accesses through the target chips' JTAG or similar serial debug interface. Since pins are at a premium, the technology provides for the sharing of the debug pin pool by trace, trigger, and other debug functions with a small increment in silicon cost. Fixed pin formats are also supported. When the sharing of pins option is deployed, the debug pin utilization is determined at the beginning of each debug session (before the chip is directed to run the application program), maximizing the trace export bandwidth. Trace bandwidth is maximized by allocating the maximum number of pins to trace.

The debug capability and building blocks within a system may vary. The emulator software therefore establishes the configuration at run-time. This approach requires the hardware blocks to meet a set of constraints dealing with configuration and register organization. Other components provide a hardware search capability designed to locate the blocks and other peripherals in the system memory map. The emulator software uses a search facility to locate the resources. The address where the modules are located and a type ID uniquely identifies each block found. Once the IDs are found, a design database may be used to ascertain the exact configuration and all system inputs and outputs.

The host computer is generally a PC with at least 64 Mbytes of memory and capable of running at least Windows95, SR-2, Windows NT, or later versions of Windows. The PC must support one of the communications interfaces required by the emulator, for example:

Ethernet 10T and 100T, TCP/IP protocol;

Universal Serial Bus (USB), rev 1.x;

Firewire, IEEE 1394; and/or

Parallel Port (SPP, EPP, and ECP).

The emulation controller 12 provides a bridge between the host computer 10 and target system 16, handling all debug information passed between the debugger application running on the host computer and a target application executing on a DSP (or other target processor) 14.

One exemplary emulator configuration supports all of the following capabilities:

Real-time Emulation;

RTDX™;

Trace; and

Advanced Analysis.

Additionally, the emulator-to-target interface supports:

Input and output triggers;

Bit I/O; and

Managing special extended operating modes.

The emulation controller 12 accesses Real-time Emulation capabilities (execution control, memory, and register access) via a 3, 4, or 5 bit scan based interface. RTDX™ capabilities can be accessed by scan or by using three higher bandwidth RTDX™ formats that use direct target-to-emulator connections other than scan. The input and output triggers allow other system components to signal the chip with debug events and vice-versa.

The emulator 12 is partitioned into communication and emulation sections. The communication section supports communication with the host 10 on host communication links while the emulation section interfaces to the target, managing target debug functions and the device debug port. The emulator 12 communicates with the host computer 10 using e.g., one of the aforementioned industry standards communication links at 15. The host-to-emulator connection can be established with off the shelf cabling technology. Host-to-emulator separation is governed by the standards applied to the interface used.

The emulation controller 12 communicates with the target system 16 through a target cable or cables at 17. Debug, Trace, Triggers, and RTDX™ capabilities share the target cable, and in some cases, the same device pins. More than one target cable may be required when the target system deploys a trace width that cannot be accommodated in a single cable. All trace, RTDX™, and debug communication occurs over this link.

FIG. 2 diagrammatically illustrates an exemplary embodiment of a condition detector that can be provided in the target chip 14 of FIG. 1 according to the invention. The condition detector of FIG. 2 includes a lookup table (LUT), embodied in this example as a multiplexer 22. A register 21 can be loaded with appropriate data to program the lookup table 22. A plurality of monitored signals are input to the lookup table at 23, and one of the register bits B0–BN is output from the lookup table 22 in response to the monitored signals 23. The monitored signals could be, for example, architecture-specific bus control signals of the target chip, such as a read/write (R/W) signal, an ABORT signal, a memory select signal, etc. When driven by bus control signals, the condition detector of FIG. 2 performs the function of a bus comparator, detecting when the bus is in a predetermined condition or conditions.

The lookup table arrangement of FIG. 2 is particularly advantageous when monitoring bus control signals because such signals are typically architecture-specific. That is, although signaling such as address and data signaling is typically the same from one data processing architecture to another, bus control signals are often architecture-specific in nature. Using the lookup table of FIG. 2, the desired bus condition or conditions can be identified regardless of which architecture-specific bus control signals are input to the lookup table 22. Because the behavior of the monitored signals 23 is known, the desired condition detection bits can be loaded into the register 21 to program the lookup table. Regardless of the data processing architecture that produces the monitored signals 23, the register 21 can be programmed to indicate the condition or conditions of interest. The condition detection indication produced by the lookup table 22 of FIG. 2 can be provided, for example, to conventional debug facilities within the target chip 14 or emulator 12 for use in emulation/test/debug operations.

FIG. 3 illustrates an example of a truth table which can be implemented by the lookup table 22 of FIG. 2. The truth table of FIG. 3 is applicable to a first data processing architecture, but another truth table, with different values of B0, B1 . . . BN, could be used for another data processing architecture whose monitored signals are not identical to the monitored signals used to generate the truth table of FIG. 3. Thus, according to the invention, any set of architecture-specific signals can be monitored by simply loading the register 21 to program the lookup table 22 according to the truth table needed to detect the desired condition or conditions with respect to the monitored signals. Thus, the condition detector of FIG. 2 can be easily used with any target device, regardless of its data processing architecture. Loading the register 21 to program the lookup table 22 for any given set of monitored signals is advantageously much simpler than designing, for each possible set of architecture-specific signals, a unique combinational circuit that implements the truth table required to detect the selected condition or conditions associated with the monitored signals.

FIG. 4 diagrammatically illustrates another exemplary embodiment of a condition detector according to the invention. The embodiment of FIG. 4 includes a plurality of lookup tables 22 whose condition detection outputs are provided to a combinational logic circuit, in this example an AND gate 31, which produces the desired condition detection. This embodiment thus permits the user to monitor the behavior of a plurality of different sets of signals 23, and combine the detected behavior as desired to produce a "compound" condition detection indication from the various individual condition detection indications of the lookup tables.

FIG. 5 illustrates examples of how the monitored signals 23 of a given lookup table 22 can be developed. As shown, an emulation signal 51 can select the monitored signals 23 from among a plurality of buses. The buses Bus1–BusN can be, for example, buses of a single data processing core or buses from a plurality of data processing cores. As mentioned earlier, the signals and their meanings can vary from bus to bus, but the lookup table 22 can be programmed specifically for the selected bus.

Although exemplary embodiments of the invention are described above in detail, this does not limit the scope of the invention, which can be practiced in a variety of embodiments.

What is claimed is:

1. A data processing emulation support apparatus for detecting a data processing condition of a data processing apparatus indicated by a predetermined number of digital data processing signals, comprising:

an input coupled to said data processing apparatus and receiving said digital data processing signals;

a register storing a predetermined plurality of bits; and a lookup table multiplexer coupled to said input and said register, said lookup table multiplexer having an output, for each combination of said digital data processing signals said look up table multiplexer coupling a corresponding one of said predetermined plurality of bits of said register to said output.

2. The data processing emulation support apparatus of claim 1, wherein:

said register is writable whereby said data processing condition of said predetermined number of data processing signals is changeable by writing said predetermined number of bits into said register.

3. The data processing emulation support apparatus of claim 1, wherein:

said predetermined number of data processing signals consist of architecture-specific bus control signals.

4. The data processing emulation support apparatus of claim 3, wherein:

said predetermined number of data processing signals include a bus read/write signal.

5. The data processing emulation support apparatus of claim 3, wherein:

said predetermined number of data processing signals include a bus abort signal.

6. The data processing emulation support apparatus of claim 3, wherein:
said predetermined number of data processing signals include a bus memory select signal.

7. The data processing emulation support apparatus of claim 3, further comprising:
a multiplexer having a plurality of inputs each receiving an architecture-specific bus control signal from a corresponding bus, an emulation signal input receiving an emulation signal and an output supplying said architecture-specific bus control signal from a bus selected dependent upon said emulation signal.

8. The data processing emulation support apparatus of claim 1, wherein:
each of said plurality of bits stored in said register has a first digital state if said corresponding combination of digital data processing signals indicates said data processing condition to be detected and a second opposite digital state if said corresponding combination of digital data processing signals does not indicate said data processing condition to be detected.

9. The data processing emulation support apparatus of claim 1, wherein:
each of said plurality of bits stored in said register has a first digital state if said corresponding combination of digital data processing signals indicates said data processing condition to be detected and a second opposite digital state if said corresponding combination of digital data processing signals does not indicate said data processing condition to be detected.

10. A data processing emulation support apparatus for detecting a data processing condition of a data processing apparatus indicated by a predetermined number of digital data processing signals, comprising:
a plurality of condition detection circuits each including
an input coupled to said data processing apparatus and receiving said digital data processing signals,
a register storing a predetermined plurality of bits, and
a lookup table multiplexer coupled to said input and said register, said lookup table multiplexer having an output, for each combination of said digital data processing signals said look up table multiplexer coupling a corresponding one of said predetermined plurality of bits of said register to said output; and
a combinational logic circuit receiving said output signal of said lookup table multiplexer of each condition detection circuit forming a combination signal of said outputs of said lookup table multiplexer of said condition detection circuits.

11. The apparatus of claim 10, wherein said combinational logic circuit is an OR gate.

12. The data processing emulation support apparatus of claim 10, wherein:
said register of each condition detection circuit is writable whereby said data processing condition of said predetermined number of data processing signals is changeable by writing said predetermined number of bits into said register.

13. The data processing emulation support apparatus of claim 10, wherein:
said predetermined number of data processing signals consist of architecture-specific bus control signals.

14. The data processing emulation support apparatus of claim 13, wherein:
said predetermined number of data processing signals include a bus read/write signal.

15. The data processing emulation support apparatus of claim 13, wherein:
said predetermined number of data processing signals include a bus abort signal.

16. The data processing emulation support apparatus of claim 13, wherein:
said predetermined number of data processing signals include a bus memory select signal.

* * * * *

UNITED STATES PATENT AND TRADEMARK OFFICE
CERTIFICATE OF CORRECTION

PATENT NO.       : 7,113,902 B2
APPLICATION NO.  : 09/798555
DATED            : September 26, 2006
INVENTOR(S)      : Swoboda It is certified that error appears in the above-identified patent and that said Letters Patent is hereby corrected as shown below:

Delete title pages, showing and substitute therefore the attached title pages.
Delete columns 1 line 1 through columns 12 line 36 and Insert columns 1 line 1 through columns 12 line 36 as attached.

Signed and Sealed this

Third Day of June, 2008

JON W. DUDAS
*Director of the United States Patent and Trademark Office*

(12) United States Patent
Swoboda

(10) Patent No.: US 7,113,902 B2
(45) Date of Patent: Sep. 26, 2006

(54) DATA PROCESSING CONDITION DETECTOR WITH TABLE LOOKUP

(75) Inventor: Gary L. Swoboda, Sugar Land, TX (US)

(73) Assignee: Texas Instruments Incorporated, Dallas, TX (US)

(*) Notice: Subject to any disclaimer, the term of this patent is extended or adjusted under 35 U.S.C. 154(b) by 862 days.

(21) Appl. No.: 09/798,555

(22) Filed: Mar. 2, 2001

(65) Prior Publication Data
US 2001/0047253 A1    Nov. 29, 2001

Related U.S. Application Data

(60) Provisional application No. 60/186,326, filed on Mar. 2, 2000, provisional application No. 60/219,340, filed on Mar. 2, 2000.

(51) Int. Cl.
*G06F 9/455* (2006.01)
*G06F 11/00* (2006.01)

(52) U.S. Cl. .................................. 703/28; 714/28

(58) Field of Classification Search ................ 703/23, 703/28; 326/40, 39; 716/18; 714/28
See application file for complete search history.

(56) References Cited

U.S. PATENT DOCUMENTS

| 5,757,207 A | * | 5/1998 | Lytle et al. ............... 326/39 |
| 5,777,489 A | * | 7/1998 | Barbier et al. ............ 326/40 |
| 5,821,773 A | * | 10/1998 | Norman et al. ............ 326/39 |
| 5,828,824 A |  | 10/1998 | Swoboda ............... 395/183.01 |
| 6,340,897 B1 | * | 1/2002 | Lytle et al. .............. 326/40 |

OTHER PUBLICATIONS

ARM Limited, RDI 1.5.1tx and RDI 1.5.1rt; Doc. No. RDI-0032-CUST-ESPC-A; May 19, 2000; pp. 1-55.
ARM Limited, ETM9, Rev. 1, Technical Reference Manual, Doc. No. DDI 0157C, pp. i-Index-3.
ARM Limited, Embedded Trace Macrocell, Rev. 1, Specification, Doc. No. IHI 0014E, pp. i-Index-3.

* cited by examiner

*Primary Examiner*—Paul Rodriguez
*Assistant Examiner*—Dwin M. Craig
(74) *Attorney, Agent, or Firm*—Robert D. Marshall, Jr.; W. James Brady, III; Frederick J. Telecky, Jr.

(57) ABSTRACT

In support of data processing emulation, a data processing condition indicated by a predetermined number of digital data processing signals can be detected by applying the digital data processing signals to a lookup table (LUT) that is programmable according to how the digital data processing signals (23) indicate the data processing condition. The lookup table is responsive to said digital data processing signals for determining whether said data processing condition exists.

22 Claims, 1 Drawing Sheet

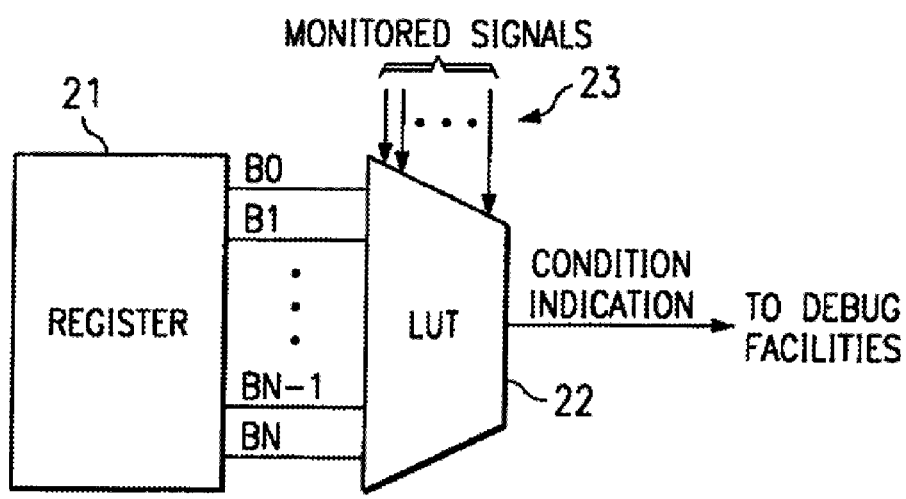

DATA PROCESSING CONDITION DETECTOR WITH TABLE LOOKUP

This application claims the priority under 35 U.S.C. 119(e)(1) of the following co-pending U.S. provisional applications: 60/186,326 filed on Mar. 2, 2000 now U.S. patent application Ser. No. 09/798,173; and 60/219,340 originally filed on Mar. 2, 2000 as non-provisional U.S. Ser. No. 09/515,093 and thereafter converted to provisional application status by a petition granted on Aug. 18, 2000.

FIELD OF THE INVENTION

The invention relates generally to electronic data processing and, more particularly, to emulation, simulation and test capabilities of electronic data processing devices and systems.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive realtime debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large amount of subsequent design time is expended on test pattern creation and upgrading.

Even if a significant investment were made to design a module to be reusable and to fully create and grade its test patterns, subsequent use of the module may bury it in application specific logic, and make its access difficult or impossible. Consequently, it is desirable to avoid this pitfall.

The advances of IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

Emulation technology utilizing scan based emulation and multiprocessing debug was introduced over 10 years ago. In 1988, the change from conventional in circuit emulation to scan based emulation was motivated by design cycle time pressures and newly available space for on-chip emulation. Design cycle time pressure was created by three factors: higher integration levels—such as on-chip memory; increasing clock rates—caused electrical intrusiveness by emulation support logic; and more sophisticated packaging—created emulator connectivity issues.

Today these same factors, with new twists, are challenging a scan based emulator's ability to deliver the system debug facilities needed by today's complex, higher clock rate, highly integrated designs. The resulting systems are smaller, faster, and cheaper. They are higher performance with footprints that are increasingly dense. Each of these positive system trends adversely affects the observation of system activity, the key enabler for rapid system development. The effect is called "vanishing visibility".

Application developers prefer visibility and control of all relevant system activity. The steady progression of integration levels and increases in clock rates steadily decrease the visibility and control available over time. These forces create a visibility and control gap, the difference between the desired visibility and control level and the actual level available. Over time, this gap is sure to widen. Application development tool vendors are striving to minimize the gap growth rate. Development tools software and associated hardware components must do more with less and in different ways; tackling the ease of use challenge is amplified by these forces.

With today's highly integrated System-On-a-Chip (SOC) technology, the visibility and control gap has widened dramatically. Traditional debug options such as logic analyzers and partitioned prototype systems are unable to keep pace with the integration levels and ever increasing clock rates of today's systems.

As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed, building system components in a way that enabled the construction of prototyping systems with exposed buses. This approach is also under siege from the ever-increasing march of system clock rates. As CPU clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. We have entered an era where production devices must serve as the platform for application development.

Increasing CPU clock rates are also accelerating the demise of other simple visibility mechanisms. Since the CPU clock rates can exceed maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity.

As visibility and control diminish, the development tools used to develop the application become less productive. The tools also appear harder to use due to the increasing tool complexity required to maintain visibility and control. The visibility, control, and ease of use issues created by systems-on-a-chip are poised to lengthen product development cycles.

Even as the integration trends present developers with a difficult debug environment, they also present hope that new approaches to debug problems will emerge. The increased densities and clock rates that create development cycle time pressures also create opportunities to solve them.

On-chip, debug facilities are more affordable than ever before. As high speed, high performance chips are increasingly dominated by very large memory structures, the system cost associated with the random logic accompanying the CPU and memory subsystems is dropping as a percentage of total system cost. The cost of a several thousand gates is at an all time low, and can in some cases be tucked into a corner of today's chip designs. Cost per pin in today's high density packages has also dropped, making it easier to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs.

Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

The emulation technology of the present invention uses the debug upside opportunities noted above to provide developers with an arsenal of debug capability aimed at narrowing the control and visibility gap.

This emulation technology delivers solutions to the complex debug problems of today's highly integrated embedded real-time systems. This technology attacks the loss of visibility, control, and ease of use issues described in the preceding section while expanding the feature set of current emulators.

The on-chip debug component of the present invention provides a means for optimizing the cost and debug capabilities. The architecture allows for flexible combinations of emulation components or peripherals tailored to meet system cost and time to market constraints. The scalability aspect makes it feasible to include them in production devices with manageable cost and limited performance overhead.

BRIEF DESCRIPTION OF THE DRAWINGS

FIG. 1 diagrammatically illustrates exemplary embodiments of an emulation system according to the invention.

FIG. 2 diagrammatically illustrates an exemplary embodiment of a condition detector according to the invention.

FIG. 3 illustrates an exemplary truth table which describes a desired relationship between the monitored signals of FIG. 2 and the register contents of FIG. 2.

FIG. 4 diagrammatically illustrates exemplary embodiments of an extended condition detector according to the invention.

FIG. 5 diagrammatically illustrates examples of how the monitored signals of FIGS. 2 and 4 can be developed.

DETAILED DESCRIPTION

Emulation, debug, and simulation tools of the present invention are described herein. The emulation and debug solutions described herein are based on the premise that, over time, some if not most debug functions traditionally performed off chip must be integrated into the production device if they are to remain in the developer's debug arsenal. To support the migration of debug functions on chip, the present invention provides a powerful and scalable portfolio of debug capabilities for on-chip deployment. This technology preserves all the gains of initial JTAG technology while adding capabilities that directly assault the visibility, control, and ease of use issues created by the vanishing visibility trend.

Four significant architectural infrastructure components spearhead the assault on the control and visibility gap described earlier herein:

1. Real-time Emulation (RTE);

2. Real-time Data Exchange (RTDX™ a trademark of Texas Instruments Incorporated);

3. Trace; and

4. Advanced Analysis.

These components address visibility and control needs as shown in Table 1.

TABLE 1

Emulation System Architecture and Usage

| Architectural Component | Visibility Provisions | Control Provisions | Debug Usage |
|---|---|---|---|
| RTE | Static view of the CPU and memory state after background program is stopped. Interrupt driven code continues to execute. | Analysis components are used to stop execution of background program. | Basic debug Computational problems Code design problems |
| RTDX™ | Debugger software interacts with the application code to exchange commands and data while the application continues to execute. | Analysis components are used to identify observation points and interrupt program flow to collect data. | Dynamic instrumentation Dynamic variable adjustments Dynamic data collection |
| Trace | Bus snooper hardware collects selective program flow and data transactions for export without interacting with the application. | Analysis components are used to define program segments and bus transactions that are to be recorded for export. | Prog. Flow corruption debug Memory corruption Benchmarking Code Coverage Path Coverage Program timing problems |
| Analysis | Allows observation of occurrences of events or event sequences. Measure elapsed time between events. Generate external triggers. | Alter program flow after the detection of events or event sequences. | Benchmarking Event/sequence identification Ext. trigger generation Stop program execution Activate Trace and RTDX™ |

Real-Time Emulation (RTE) provides a base set of fixed capabilities for real-time execution control (run, step, halt, etc.) and register/memory visibility. This component allows the user to debug application code while real-time interrupts continue to be serviced. Registers and memory may be accessed in real-time with no impact to interrupt processing. Users may distinguish between real-time and non real-time interrupts, and mark code that must not be disturbed by real-time debug memory accesses. This base emulation capability includes hardware that can be configured as two single point hardware breakpoints, a single data watchpoint, an event counter, or a data logging mechanism. The EMU pin capability includes trigger I/Os for multiprocessor event processing and a uni-directional (target to host) data logging mechanism.

RTDX™ provides real-time data transfers between an emulator host and target application. This component offers both bi-directional and uni-directional DSP target/host data transfers facilitated by the emulator. The DSP (or target) application may collect target data to be transferred to the host or receive data from the host, while emulation hardware (within the DSP and the emulator) manages the actual transfer. Several RTDX™ transfer mechanisms are supported, each providing different levels of bandwidth and pin utilization allowing the trade off of gates and pin availability against bandwidth requirements.

Trace is a non-intrusive mechanism of providing visibility of the application activity. Trace is used to monitor CPU related activity such as program flow and memory accesses, system activity such as ASIC state machines, data streams and CPU collected data. Historical trace technology also used logic analyzer like collection and special emulation (SEs) devices with more pins than a production device. The logic analyzer or like device processed native representations of the data using a state machine like programming interface (filter mechanism). This trace model relied on all activity being exported with external triggering selecting the data that needed to be stored, viewed and analyzed.

Existing logic analyzer like technology does not, however, provide a solution to decreasing visibility due to higher integration levels, increasing clock rates and more sophisticated packaging. In this model, the production device must provide visibility through a limited number of pins. The data exported is encoded or compressed to reduce the export bandwidth required. The recording mechanism becomes a pure recording device, packing exported data into a deep trace memory. Trace software is used to convert the recorded data into a record of system activity.

On-chip Trace with high speed serial data export, in combination with Advanced Analysis provides a solution for SOC designs. Trace is used to monitor CPU related activity such as program flow and memory accesses, system activity such as ASIC state machines, data streams etc. and CPU collected data. This creates four different classes of trace data:

Program flow and timing provided by the DSP core (PC trace);
Memory data references made by the DSP core or chip level peripherals (Data reads and writes);
Application specific signals and data (ASIC activity); and
CPU collected data.

Collection mechanisms for the four classes of trace data are modular allowing the trade off of functionality verses gates and pins required to meet desired bandwidth requirements.

The RTDX™ and Trace functions provide similar, but different forms of visibility. They differ in terms of how data is collected, and the circumstances under which they would be most effective. A brief explanation is included below for clarity.

RTDX™ (Real Time Data eXchange) is a CPU assisted solution for exchanging information; the data to be exchanged have a well-defined behavior in relation to the program flow. For example, RTDX™ can be used to record the input or output buffers from a DSP algorithm. RTDX™ requires CPU assistance in collecting data hence there is definite, but small, CPU bandwidth required to accomplish this. Thus, RTDX™ is an application intrusive mechanism of providing visibility with low recurring overhead cost.

Trace is a non-intrusive, hardware-assisted collection mechanism (such as, bus snoopers) with very high bandwidth (BW) data export. Trace is used when there is a need to export data at a very high data rate or when the behavior of the information to be traced is not known, or is random in nature or associated with an address. Program flow is a typical example where it is not possible to know the behavior a priori. The bandwidth required to export this class of information is high. Data trace of specified addresses is another example. The bandwidth required to export data trace is very high.

Trace data is unidirectional, going from target to host only. RTDX™ can exchange data in either direction although unidirectional forms of RTDX™ are supported (data logging). The Trace data path can also be used to provide very high speed uni-directional RTDX™ (CPU collected trace data).

The high level features of Trace and RTDX™ are outlined in Table 2.

TABLE 2

RTDX™ and Trace Features

| Features | RTDX™ | Trace |
|---|---|---|
| Bandwidth/pin | Low | High |
| Intrusiveness | Intrusive | Non-intrusive |
| Data Exchange | Bi-directional or uni-directional | Export only |
| Data collection | Cpu assisted | CPU or Hardware assisted |
| Data transfer | No extra hardware for minimum BW (optional hardware for higher BW) | Hardware assisted |
| Cost | Relatively low recurring cost | Relatively high recurring cost |

Advanced analysis provides a non-intrusive on-chip event detection and trigger generation mechanism. The trigger outputs created by advanced analysis control other infrastructure components such as Trace and RTDX™. Historical trace technology used bus activity exported to a logic analyzer to generate triggers that controlled trace within the logic analyzer unit or generated triggers which were supplied to the device to halt execution. This usually involved a chip that had more pins than the production device (an SE or special emulation device). This analysis model does not work well in the System-on-a-Chip (SOC) era as the integration levels and clock rates of today's devices preclude full visibility bus export.

Advanced analysis provides affordable on-chip instruction and data bus comparators, sequencers and state machines, and event counters to recreate the most important portions of the triggering function historically found off chip. Advanced analysis provides the control aspect of debug triggering mechanism for Trace, RTDX™ and Real-Time Emulation. This architectural component identifies events, tracks event sequences, and assigns actions based on their occurrence (break execution, enable/disable trace, count, enable/disable RTDX™, etc.). The modular building blocks for this capability include bus comparators, external event generators, state machines or state sequencers, and trigger generators. The modularity of the advanced analysis system allows the trade off of functionality versus gates.

Emulator capability is created by the interaction of four emulator components:

1. debugger application program;

2. host computer;

3. emulation controller; and 4. on-chip debug facilities.

These components are connected as shown in FIG. 1. The host computer 10 is connected to an emulation controller 12 (external to the host) with the emulation controller (also referred to herein as the emulator or the controller) also connected to the target system 16. The user preferably controls the target application through a debugger application program, running on the host computer, for example, Texas Instruments' Code Composer Studio program.

A typical debug system is shown in FIG. 1. This system uses a host computer 10 (generally a PC) to access the debug capabilities through an emulator 12. The debugger application program presents the debug capabilities in a user-friendly form via the host computer. The debug resources are allocated by debug software on an as needed basis, relieving the user of this burden. Source level debug utilizes the debug resources, hiding their complexity from the user. The debugger together with the on-chip Trace and triggering facilities provide a means to select, record, and display chip activity of interest. Trace displays are automatically correlated to the source code that generated the trace log. The emulator provides both the debug control and trace recording function.

The debug facilities are programmed using standard emulator debug accesses through the target chips' JTAG or similar serial debug interface. Since pins are at a premium, the technology provides for the sharing of the debug pin pool by trace, trigger, and other debug functions with a small increment in silicon cost. Fixed pin formats are also supported. When the sharing of pins option is deployed, the debug pin utilization is determined at the beginning of each debug session (before the chip is directed to run the application program), maximizing the trace export bandwidth. Trace bandwidth is maximized by allocating the maximum number of pins to trace.

The debug capability and building blocks within a system may vary. The emulator software therefore establishes the configuration at run-time. This approach requires the hardware blocks to meet a set of constraints dealing with configuration and register organization. Other components provide a hardware search capability designed to locate the blocks and other peripherals in the system memory map. The emulator software uses a search facility to locate the resources. The address where the modules are located and a type ID uniquely identifies each block found. Once the IDs are found, a design database may be used to ascertain the exact configuration and all system inputs and outputs.

The host computer is generally a PC with at least 64 Mbytes of memory and capable of running at least Windows95, SR-2, Windows NT, or later versions of Windows. The PC must support one of the communications interfaces required by the emulator, for example:

Ethernet 10T and 100T, TCP/IP protocol;

Universal Serial Bus (USB), rev 1.x;

Firewire, IEEE 1394; and/or

Parallel Port (SPP, EPP, and ECP).

The emulation controller 12 provides a bridge between the host computer 10 and target system 16, handling all debug information passed between the debugger application running on the host computer and a target application executing on a DSP (or other target processor) 14.

One exemplary emulator configuration supports all of the following capabilities:

Real-time Emulation;

RTDX™;

Trace; and

Advanced Analysis.

Additionally, the emulator-to-target interface supports:

Input and output triggers;

Bit I/O; and

Managing special extended operating modes.

The emulation controller 12 accesses Real-time Emulation capabilities (execution control, memory, and register access) via a 3, 4, or 5 bit scan based interface. RTDX™ capabilities can be accessed by scan or by using three higher bandwidth RTDX™ formats that use direct target-to-emulator connections other than scan. The input and output triggers allow other system components to signal the chip with debug events and vice-versa.

The emulator 12 is partitioned into communication and emulation sections. The communication section supports communication with the host 10 on host communication links while the emulation section interfaces to the target, managing target debug functions and the device debug port. The emulator 12 communicates with the host computer 10 using e.g., one of the aforementioned industry standards communication links at 15. The host-to-emulator connection can be established with off the shelf cabling technology. Host-to-emulator separation is governed by the standards applied to the interface used.

The emulation controller 12 communicates with the target system 16 through a target cable or cables at 17. Debug, Trace, Triggers, and RTDX™ capabilities share the target cable, and in some cases, the same device pins. More than one target cable may be required when the target system deploys a trace width that cannot be accommodated in a single cable. All trace, RTDX™, and debug communication occurs over this link.

FIG. 2 diagrammatically illustrates an exemplary embodiment of a condition detector that can be provided in the target chip 14 of FIG. 1 according to the invention. The condition detector of FIG. 2 includes a lookup table (LUT), embodied in this example as a multiplexer 22. A register 21 can be loaded with appropriate data to program the lookup table 22. A plurality of monitored signals are input to the lookup table at 23, and one of the register bits B0–BN is output from the lookup table 22 in response to the monitored signals 23. The monitored signals could be, for example, architecture-specific bus control signals of the target chip, such as a read/write (R/W) signal, an ABORT signal, a memory select signal, etc. When driven by bus control signals, the condition detector of FIG. 2 performs the function of a bus comparator, detecting when the bus is in a predetermined condition or conditions.

The lookup table arrangement of FIG. 2 is particularly advantageous when monitoring bus control signals because such signals are typically architecture-specific. That is, although signaling such as address and data signaling is typically the same from one data processing architecture to another, bus control signals are often architecture-specific in nature. Using the lookup table of FIG. 2, the desired bus condition or conditions can be identified regardless of which architecture-specific bus control signals are input to the lookup table 22. Because the behavior of the monitored signals 23 is known, the desired condition detection bits can be loaded into the register 21 to program the lookup table. Regardless of the data processing architecture that produces the monitored signals 23, the register 21 can be programmed to indicate the condition or conditions of interest. The condition detection indication produced by the lookup table 22 of FIG. 2 can be provided, for example, to conventional debug facilities within the target chip 14 or emulator 12 for use in emulation/test/debug operations.

FIG. 3 illustrates an example of a truth table which can be implemented by the lookup table 22 of FIG. 2. The truth table of FIG. 3 is applicable to a first data processing architecture, but another truth table, with different values of B0, B1 . . . BN, could be used for another data processing architecture whose monitored signals are not identical to the monitored signals used to generate the truth table of FIG. 3. Thus, according to the invention, any set of architecture-specific signals can be monitored by simply loading the register 21 to program the lookup table 22 according to the truth table needed to detect the desired condition or conditions with respect to the monitored signals. Thus, the condition detector of FIG. 2 can be easily used with any target device, regardless of its data processing architecture. Loading the register 21 to program the lookup table 22 for any given set of monitored signals is advantageously much simpler than designing, for each possible set of architecture-specific signals, a unique combinational circuit that implements the truth table required to detect the selected condition or conditions associated with the monitored signals.

FIG. 4 diagrammatically illustrates another exemplary embodiment of a condition detector according to the invention. The embodiment of FIG. 4 includes a plurality of lookup tables 22 whose condition detection outputs are provided to a combinational logic circuit, in this example an AND gate 31, which produces the desired condition detection. This embodiment thus permits the user to monitor the behavior of a plurality of different sets of signals 23, and combine the detected behavior as desired to produce a "compound" condition detection indication from the various individual condition detection indications of the lookup tables.

FIG. 5 illustrates examples of how the monitored signals 23 of a given lookup table 22 can be developed. As shown, an emulation signal 51 can select the monitored signals 23 from among a plurality of buses. The buses Bus1–BusN can be, for example, buses of a single data processing core or buses from a plurality of data processing cores. As mentioned earlier, the signals and their meanings can vary from bus to bus, but the lookup table 22 can be programmed specifically for the selected bus.

Although exemplary embodiments of the invention are described above in detail, this does not limit the scope of the invention, which can be practiced in a variety of embodiments.

What is claimed is:

1. A drive apparatus for a plastics processing machine, comprising:
   a motor unit having a hollow shaft for support of a rotor and a shaft stub;
   a face plate attached to one end surface of the motor unit; and
   a thrust bearing assembly mounted to the face plate for direct support of the shaft stub which forms an abutment for a separate driveshaft of the plastics processing machine, said thrust bearing assembly being disposed, at least partially, in the hollow shaft in coaxial relationship thereto.

2. The drive apparatus of claim 1, wherein the thrust bearing assembly is disposed entirely in the hollow shaft.

3. The drive apparatus of claim 1, wherein the thrust bearing assembly includes a tandem bearing.

4. The drive apparatus of claim 1, wherein the driveshaft is disposed in axial alignment with the shaft stub.

5. The drive apparatus of claim 1, wherein the motor unit has a motor housing, said thrust bearing assembly being detachably secured to the motor housing.

6. The drive apparatus of claim 5, wherein the thrust bearing assembly is bolted to the motor housing.

7. The drive apparatus of claim 1, and further comprising a transmission unit placed between the hollow shaft and the driveshaft for support and propulsion of the driveshaft, said transmission unit including a flange having a tubular portion which projects into the hollow shaft, said flange being mounted to the hollow shaft.

8. The drive apparatus of claim 7, wherein the flange is bolted to an end surface of the hollow shaft.

9. The drive apparatus of claim 1, and further comprising a sealing element for sealing the hollow shaft to protect the thrust bearing assembly against contamination.

10. The drive apparatus of claim 7, wherein the transmission unit includes a bushing received in the flange in driving relationship with the driveshaft.

11. The drive apparatus of claim 10, wherein the bushing is operatively connected to the driveshaft via a tooth system.

12. The drive apparatus of claim 1, wherein the plastics processing machine is an extruder having an extruder screw, said driveshaft being operatively connected to the extruder screw.

13. The drive apparatus of claim 12, wherein the motor unit is constructed as synchronous motor as direct drive for the extruder.

14. The drive apparatus of claim 1, wherein the plastics processing machine is an injection molding machine having a clamping unit, said driveshaft being operatively connected to the clamping unit.

15. A set of modular elements for the construction of a drive apparatus for a plastics processing machine, said set comprising:
   a motor unit including a housing defining an interior space, and a hollow shaft which extends across the interior space of the housing and supports a rotor interacting with a stator across an air gap;
   a transmission unit, received in the hollow shaft at one end thereof, for transmitting a torque from the motor unit onto a driveshaft of a plastics processing machine;
   a thrust bearing assembly, received in the hollow shaft at another end thereof in coaxial relationship thereto in axially spaced-apart relationship to the transmission unit, for directly supporting a shaft stub having an end portion to provide an abutment for the driveshaft; and
   a face plate detachably secured to the housing in confronting relationship to the thrust bearing assembly.

16. The set of claim 15, wherein the transmission unit includes a flange detachably secured to the hollow shaft and a bushing received in the flange and constructed in driving relationship with the driveshaft.

17. An extruder, comprising:
   an extruder screw; and
   a drive apparatus for operating the extruder screw, said drive apparatus including a motor unit having a rotor with a hollow shaft in driving relationship with the extruder screw, a face plate attached to one end surface of the motor unit, and a thrust bearing assembly mounted to the face plate for direct support of a shaft stub which forms an abutment for the extruder screw, said thrust assembly being disposed, at least partially, in the hollow shaft in coaxial relationship thereto.

18. The extruder of claim 17, and further comprising a transmission unit placed between the hollow shaft and the driveshaft for support and propulsion of the extruder screw, said transmission unit including a flange having a tubular portion which projects into the hollow shaft, said flange being mounted to the hollow shaft.

19. The extruder of claim 18, wherein the transmission unit includes a bushing received in the flange in driving relationship with the extruder screw.

20. The extruder of claim 19, wherein the bushing and the extruder screw cooperate via a tooth system.

21. The extruder of claim 17, wherein the extruder screw is partially received in the hollow shaft.

22. An injection molding machine, comprising a clamping unit for an injection mold; and a drive apparatus including a motor unit having a rotor with a hollow shaft, a face plate attached to one end surface of the motor unit, and a thrust bearing assembly mounted to the face plate for direct support of a shaft stub which forms an abutment for a driveshaft for the clamping unit, said thrust assembly being disposed, at least partially, in the hollow shaft in coaxial relationship thereto.

* * * * *

UNITED STATES PATENT AND TRADEMARK OFFICE
CERTIFICATE OF CORRECTION

PATENT NO. : 7,113,902 B2  Page 1 of 1
APPLICATION NO. : 09/798555
DATED : September 26, 2006
INVENTOR(S) : Gary L. Swoboda It is certified that error appears in the above-identified patent and that said Letters Patent is hereby corrected as shown below:

This certificate supersedes the Certificate of Correction issued June 3, 2008. The certificate should be vacated since no Certificate of Correction was granted for this patent number.

Signed and Sealed this

Eighth Day of July, 2008

JON W. DUDAS
*Director of the United States Patent and Trademark Office*